(12) United States Patent
Chang

(10) Patent No.: US 6,679,712 B2
(45) Date of Patent: Jan. 20, 2004

(54) FIXTURE FOR AN ELECTRICAL DEVICE

(76) Inventor: Guo-Heng Chang, No. 14, Yugangbei 3rd Rd., Chianjen Chiu, Kaohsiung (TW)

( * ) Notice: Subject to any disclaimer, the term of this patent is extended or adjusted under 35 U.S.C. 154(b) by 0 days.

(21) Appl. No.: 10/173,638

(22) Filed: Jun. 19, 2002

(65) Prior Publication Data

US 2003/0236028 A1 Dec. 25, 2003

(51) Int. Cl.[7] .............................................. H01R 13/73
(52) U.S. Cl. ........................ 439/248; 439/557; 411/21; 411/353
(58) Field of Search .................................. 411/508, 509, 411/913, 512, 338, 339, 352, 353; 439/557, 247, 248, 485, 487

(56) References Cited

U.S. PATENT DOCUMENTS

| | | | | |
|---|---|---|---|---|
| 5,383,790 A | * | 1/1995 | Kerek et al. ................ | 439/248 |
| 5,397,244 A | * | 3/1995 | Generoki et al. ........... | 439/248 |
| 5,791,850 A | * | 8/1998 | Mundt et al. ................. | 411/21 |
| 6,061,240 A | * | 5/2000 | Butterbaugh et al. | |
| 6,334,750 B1 | * | 1/2002 | Hsieh | |
| 6,364,688 B1 | * | 4/2002 | Fraley et al. ................ | 411/353 |
| 6,409,446 B1 | * | 6/2002 | Schwarz ..................... | 411/353 |
| 6,475,030 B1 | * | 11/2002 | Chang ......................... | 439/557 |

* cited by examiner

*Primary Examiner*—Gary Paumen
(74) *Attorney, Agent, or Firm*—Troxell Law Office PLLC

(57) ABSTRACT

A fixture for an electrical device includes a pin casing, a spring, a ring block and a pin. A pin casing has a trough formed from a bottom and a round-wall for containing spring and ring block. The round-wall forms at least a flange to limit ring block inside pin casing. The pin has a press portion and a wedge portion. The wedge portion passes through ring block, spring and pin casing so as to combine those together. The press portion is used for pushing the ring block to compress the spring.

7 Claims, 5 Drawing Sheets

FIXTURE FOR AN ELECTRICAL DEVICE

FIELD OF 1THE INVENTION

The present invention is relating to a fixture for an electrical device in general, and more particularly to a fixture for rapidly, easily and stably assembling a heat dissipating device and an electrical device.

BACKGROUND OF THE INVENTION

It is well known that an electrical device of high power such as CPU will produce much heat in run. In order to prevent damaging an electrical device due to overheat, a heat dissipating device is necessary to be installed for conducting heat from the electrical device. In general a heat dissipating device is a heat sink, a cooling fin or a cooling fan etc, and is directly installed above a heating electrical device by wedging method for conducting or dissipating heat. Therefore, a heat dissipating device needs a stable fixture to be closely installed above an electrical device for a good effect of cooling.

As shown in FIG. 1, a fixture 10 for adhering a heat sink 20 on the upper surface of CPU 32 is disclosed in Republic Of China (Taiwan) Patent Publication No. 254,450 "fixture for a CPU heat sink". The fixture 10 includes a tenon 11 that has a head 12 at one end and the other end is an arrow-shaped inverse-pin 13, wherein a spring 14 is employed around the tenon 11. While pushing the tenon 11, the inverse-pin 13 downward passes through through hole 21 of the heat sink 20 and through hole 31 of a PCB 30 (printed circuit board), in which the heat sink 20 is located on the upper surface of CPU 32 and the CPU 32 is bonded on the PCB 30. Due to an upward spring force from the spring 14, the tenon 11 inversely wedges the heat sink 20 and PCB 30. However, while pushing the tenon 11 by hand, it is unable to make the tenon 11 precisely position and stably wedge due to inclination or shake.

As shown in FIG. 2, a fixture 40 that comprises several pin devices to assemble and fix the heat sinks 50 on the CPU 62 of a PCB 60 is disclosed in Republic Of China (Taiwan) Patent Publication No. 454,899 "fixture (III) for a CPU heat sink". The pin device is a tenon 41 that has a head 42 and an insert 43. A spring 44 is employed between the head 42 and the insert 43, and a sleeve 45 covers the spring 44 corresponding to the pin device. A through hole 46 is formed at the center of bottom ring of the sleeve 45 for passed through the tenon 41 so that the tenon 41 passes through the through holes 51 of heat sinks 50 and the through hole 61 of PC board 61 for assembling and fixing the heat sinks 50 and the PCB 60. The head 42 of the tenon 41 must be smaller than upper opening of sleeve 45 for passing through the sleeve 45 while pushing the pin device, and larger than the opening of spring 44 for pushing the spring 44. However, the tenon 41 and the sleeve 45 of fixture 40 are usually manufactured by plastic injection molding. If the head 42 of tenon 41 deforms due to changing of temperature while running CPU 62, the head 42 may be unable to pass through the sleeve 45 because of that larger than upper opening of sleeve 45 or unable to push the spring 44 because of that smaller than the opening of spring 44, so that the fixture 40 is unable to be used normally. Further as shown in FIG. 3, it is a known fixture 70 for a CPU heat sink. The fixture 70 includes a tenon 71 that has a head 72 and an insert 73, and a sleeve 75. The tenon 71 combines with a conical spring 74 that is covered by a sleeve 75 between the head 72 and the insert 73. A ring trough 76 is formed around the lip of the sleeve 75 against the large opening 74a of conical spring 74. As shown in FIG. 4 while pushing the tenon 71, the head 72 of the tenon 71 compresses against the small opening 74b of conical spring 74 to make conical spring 74 stretch, so that the insert 73 of the tenon 71 passes through the through holes 81 of heat sinks 80 and the through hole 91 of PCB 90 to closely wedge the heat sinks 80 on the CPU 92 that is bonded on PCB 90. However, if the small opening 74b of conical spring 74 expands a little, the head 72 of tenon 71 is unable to block the small opening 74b of the conical spring 74 but passes through the conical spring 74. Moreover, while pushing force is big the large opening 74a of conical spring 74 easily deformed to make conical spring 74 jump out from the ring trough 76 of sleeve 75 that is against the large opening 74a of conical spring 74. Therefore, the fixture 70 cannot be used durably.

SUMMARY

It is a first object of the present invention to provide a fixture for an electrical device to prevent a spring jumping out from the pin. A ring block is used to limit the spring inside the pin casing. Typically, the ring block is installed against a press portion of a pin to make the spring be compressed.

It is a second object of the present invention to provide a durable fixture for an electrical device. A ring block is installed between press portion of pin and spring and is limited inside pin casing by flange of the pin casing so as to ensure the spring keeping inside the pin casing.

It is a third object of the present invention to provide a fixture for an electrical device that includes a pin casing with round-wall. The round-wall forms at least a flange. A gap is formed at the two sides of flange respectively to elasticized the flange for stuffing the ring block inside the round-wall of pin casing.

It is a fourth object of the present invention to provide a fixture for an electrical device that includes a ring block fastened inside the pin casing. By means of the press portion of pin, the ring block is pushed to make the spring be compressed so that the wedge portion of pin is able to wedge the electrical device closely. Therefore, the effect of easily, rapidly and stably wedging the electrical device can be reached.

According to the present invention, a fixture for an electrical device comprises a pin casing, a spring, a ring block and a pin. A pin casing has a bottom and a round-wall to form a containing trough for placing the spring. The bottom forms a hole and the round-wall forms at least a flange. It is preferable that a gap is formed at the two sides of the flange respectively to make round-wall outward expand for stuffing the ring block inside the pin casing. Also the flange limits the ring block without jumping out. The ring block has a through hole and the pin passes the through hole of ring block, spring and the through hole of bottom of pin casing to combine pin casing, spring, ring block and pin together. The pin has a press portion and a wedging portion. The press portion is used for pushing the ring block to compress the spring. The wedging portion is used for securely wedging an electrical device.

DETAILED DESCRIPTION OF THE PRESENT INVENTION

Figure 1:
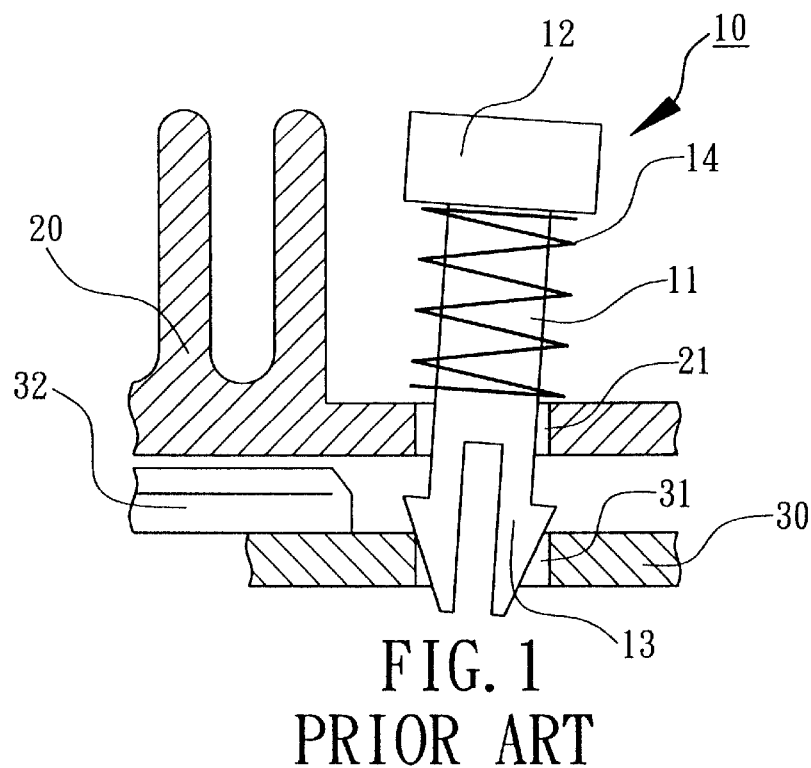
FIG. 1 is a cross-sectional view of a fixture in assembling condition disclosed in ROC. Patent Publication No. 254,450 "fixture for a CPU heat sink".
Figure 2:
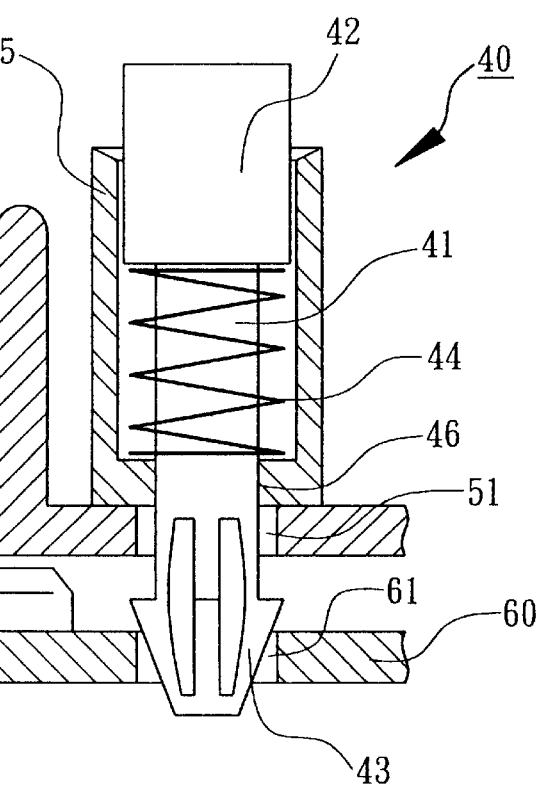
FIG. 2 is a cross-sectional view of a fixture in assembling condition disclosed in ROC Patent Publication No. 454,899 "fixture (III) for a CPU heat sink".
Figure 3:
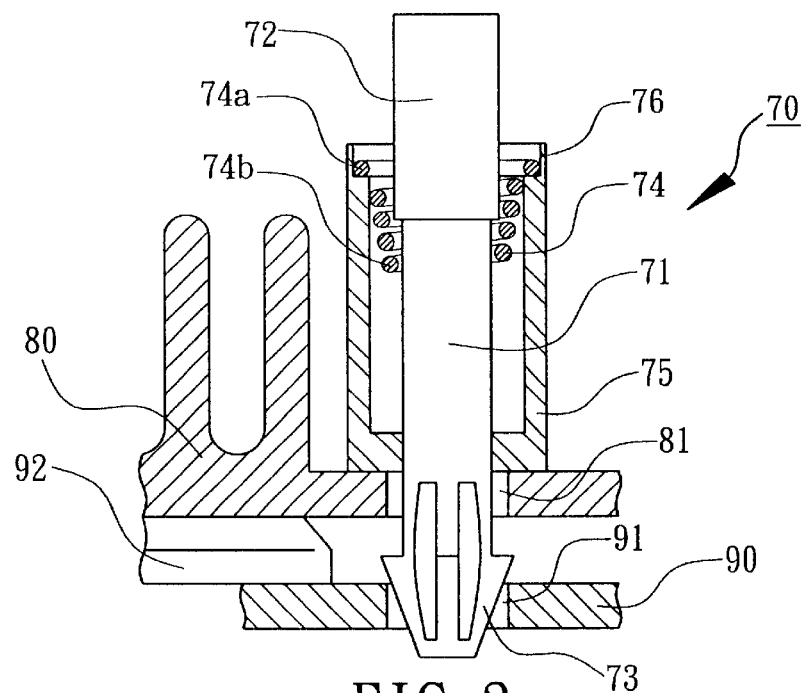
FIG. 3 is a cross-sectional view of another known fixture for a CPU heat sink.
Figure 4:
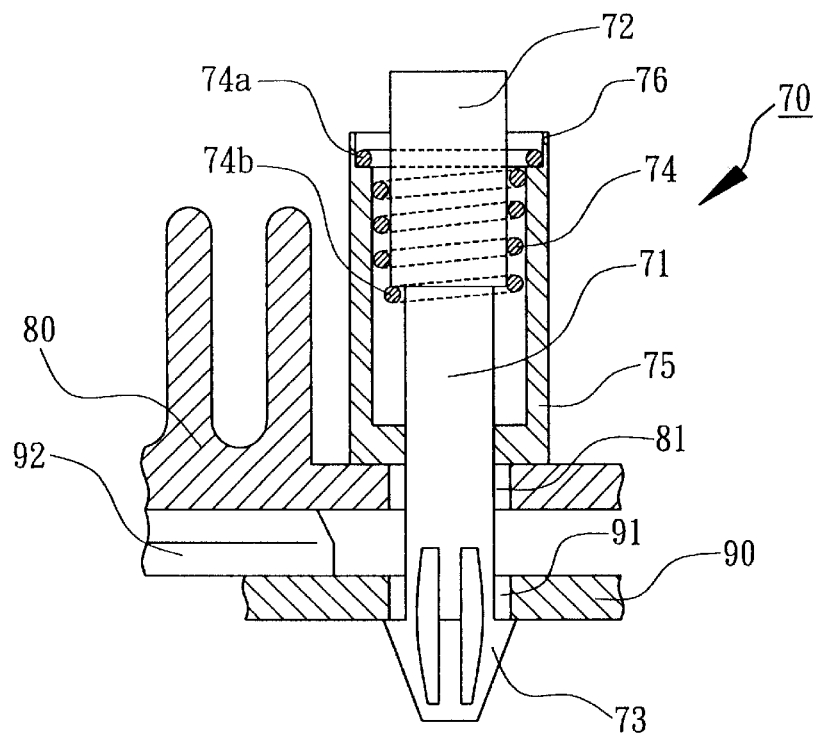
FIG. 4 is a cross-sectional view of the fixture shown in FIG.3 in assembling condition.

Referring to the drawings attached, the present invention will be described by means of the embodiments below.

Figure 5:
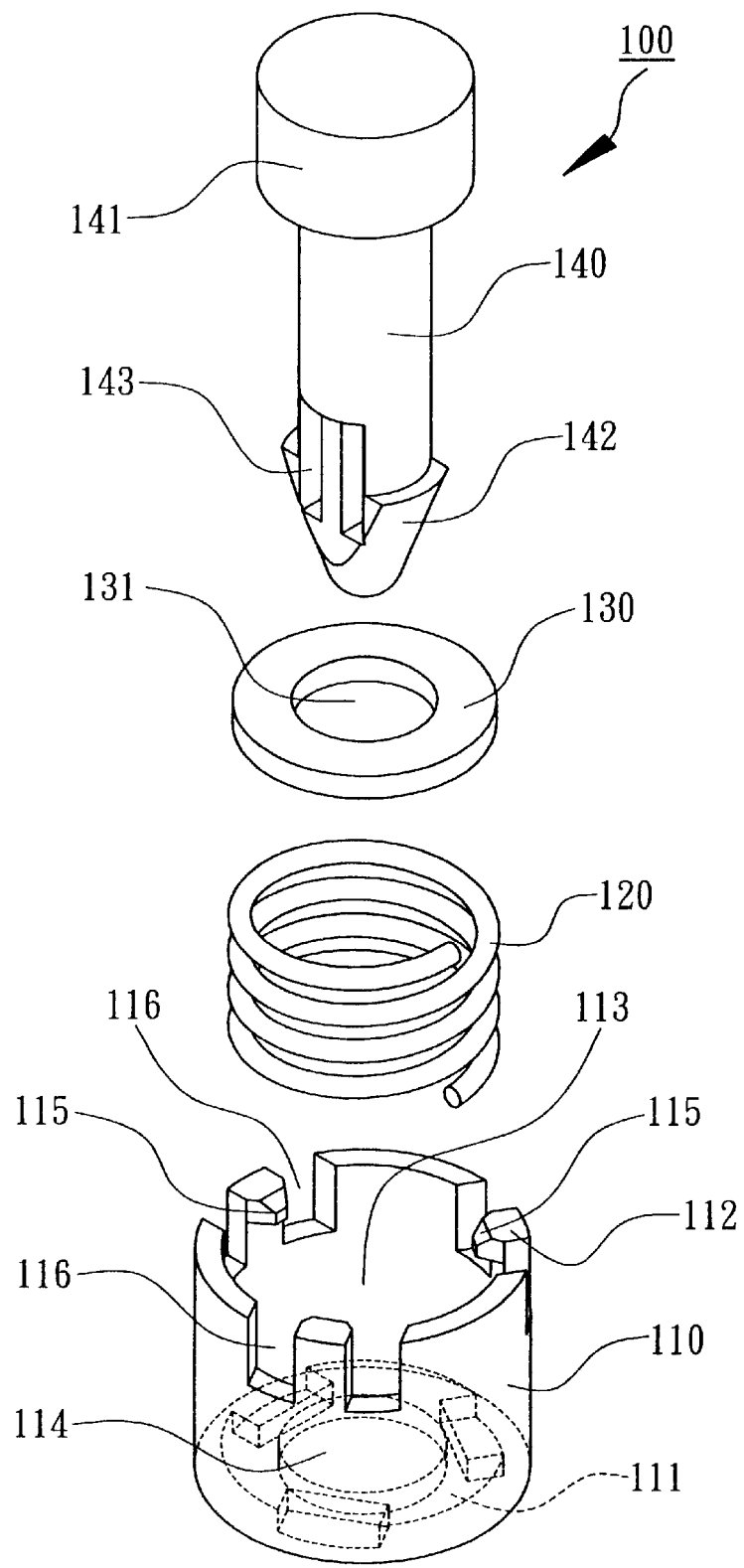
FIG. 5 is an exploded view of a fixture for an electrical device in accordance with an embodiment of the present invention.
Figure 6:
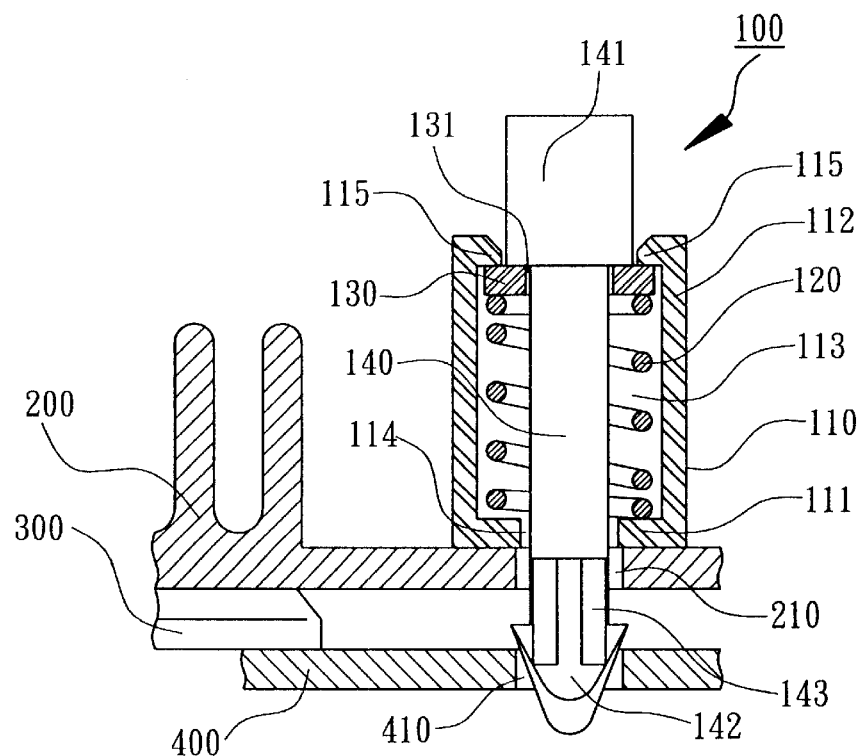
FIG. 6 is a cross-sectional view of the fixture in assembling condition in accordance with the embodiment of the present invention.

According to an embodiment of the present invention, as shown in FIGS. 5 and 6, a fixture 100 for an electrical device comprises a pin casing 110, a spring 120, a ring block 130 and a pin 140. The pin casing 110 has a trough 113 formed by a bottom 111 and a round-wall 112 in order to place a spring 120, such as helical compression spring or conical compression spring, etc. In this embodiment, the spring 120 is a compression spring for providing the fixture 100 with an elastic anti-push force while pushing to wedge. A through hole 114 is formed on the bottom 111 of pin casing 110 to let the pin 140 passing through. At least a flange 115 is formed on the round-wall 112 of pin casing 110. It is better that a gap 116 is formed at the two sides of the flange 115 respectively to make the flange 115 elastic, so that the round-wall 112 of pin casing 110 is able to outwardly expand for fastening the ring block 130. The ring block 130 is limited by the flange 115 of pin casing 110 after being fastened inside the pin casing 110 for preventing ring block 130 and spring 120 jumping out from the pin casing 110. Also the ring block 130 has a through hole 131 for wedge portion 142 of the pin 140 passing through. The pin 140 has a press portion 141 and a wedge portion 142. The wedge portion 142 of pin 140 passes through the through hole 131 of ring block 130, the spring 120 and the through hole 114 of bottom 111 of pin casing 110 so that the pin casing 110, spring 120, ring block 130 and pin 140 are combined together. Preferably, the ring block 130 of the present invention may be integrated onto the bottom of press portion 141 of pin 140. The press portion 141 of pin 140 is used for pushing the ring block 130 to make the spring 120 be compressed. Therefore, by means of the spring 120 a clamp force is formed between the wedge portion 142 of the pin 140 and the pin casing 110 so as to stably fixing an electrical device. Preferably, the wedge portion 142 has a arrow shape with two opposite inclinations and forms at least a groove 143 to let the wedge portion 142 moving elastically while passing through the through hole 131 of ring block 130 and the through hole 114 of pin casing 110 for smoothly passing through.

Figure 7:
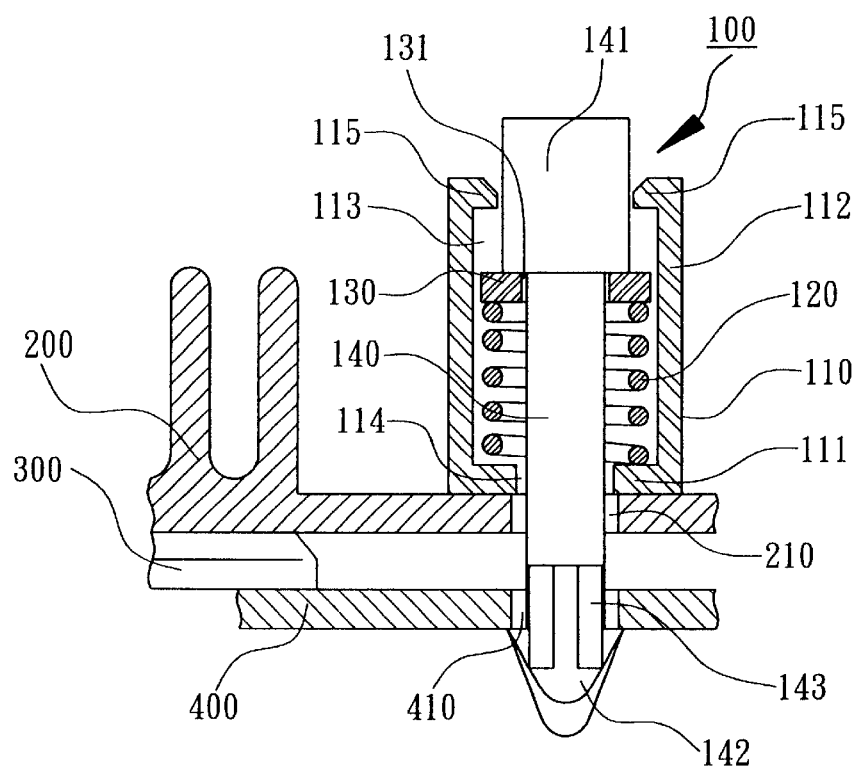
FIG. 7 is a cross-sectional view of the fixture in accordance with an embodiment of the present invention.

As shown in FIG. 6, in this embodiment, a heat sink 200 is located on a chip 300 (or a chip package). The chip 300 that is a chip with high power such as CPU is bonded on a circuit board 400. The heat sink 200 has a plurality of holes 210 corresponding to holes 410 on the circuit board 400 for assembling the heat sink 200 and the circuit board 400 by the fixture 100. When heat sink 200 and circuit board 400 are assembled, firstly the wedge portion 142 of pin 140 passes through the holes 210 of heat sink 200 so that the bottom 111 of pin casing 140 contacts with the heat sink 200. As shown in FIG. 7, the press portion 141 of pin 140 is pushed to make the ring block 130 compress against the spring 120 and make the wedge portion 142 of pin 140 pass through the holes 410 of circuit board 400. Due to an upward elastic force against the press portion 141 of pin 140 from the spring 120, the wedge portion 142 wedges the bottom surface of circuit board 400 for closely fixing the heat sink 200 and the circuit board 400. Furthermore, when the press portion 141 of pin 140 is pushed downwardly, the heat sink 200 is attached on the bottom 111 of pin casing 110 so that the pin 140 can directly pass through without inclination for rapidly positioning the holes 210 of heat sink 200 and the holes 410 of circuit board 400. Then, the heat sink 200 is easily and stably installed on the chip 300 to obtain a good cooling effect. Besides, the spring 120 is limited inside the pin casing 110 by the ring block 130 so that the spring 120 is unable to jump out from the pin 140 and the pin casing 110. Sometimes, on the basis of various requests the spring 120 may be replaced by another spring after withdrawing the ring block 130.

Figure 8:
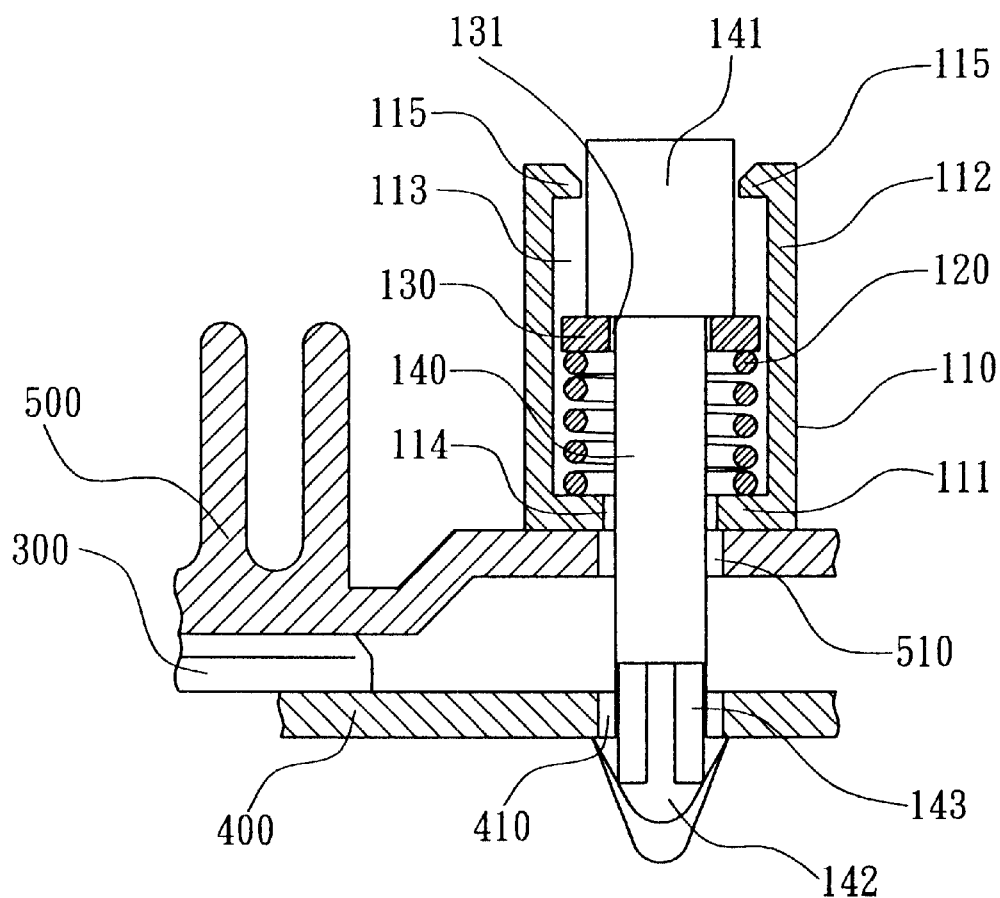
FIG. 8 is a cross-sectional view of a fixture for an electrical device in accordance with another embodiment of the present invention.

In another embodiment shown in FIG. 8, when several different types of heat sinks 500 are installed on the chip 300, the interval between the heat sinks 500 and the circuit board 400 becomes larger. The pin 140 of the fixture 100 is able to pass through the holes 510 of heat sinks 500 and the holes 410 of circuit board 400 too. Simultaneously, the spring 120 is under compression and generates an upward spring force to make the wedge portion 142 of pin 140 wedge the bottom surface of circuit board 400 for closely fixing the heat sinks 500 and the circuit board 400, so that the heat sinks 500 can be stably installed on the chip 300. This is because another longer pin 140 can be replaced for the fixture 100 if the interval between the heat sinks 500 and the circuit board 400 becomes larger. After replacing a longer pin 140, the wedging state between the heat sinks 500 and the circuit board 400 maintains stable.

Therefore according to the present invention, the ring block 130 is pushed by the press portion 141 of pin 140 to compress against the spring 120 and make the wedge portion 142 of pin 140 wedge the electrical device to complete assembly of an electrical device. Comparing with the known fixture which spring is directly compressed by the pin, it is not necessary that the press portion 141 of pin 140 of fixture 100 matches the opening of the spring 120 for size when the press portion 141 is able to push the ring block 130 down. Therefore, the trouble that the pin casing 110 splits can be avoided even under improper use. Furthermore, the size of the press portion 141 of pin 140 is not limited by the spring 120 so that an universal pin 140 manufactured by plastic injection molding is suitable for various fixtures. The ring block 130 may be integrated with the pin 140 when both are made by plastic injection, easily fastened inside the pin casing 110 and limited by the flange 115 for preventing the spring 120 jumping out from the pin casing 110. Therefore, the fixture 100 of the present invention can easily, rapidly and stably install a heat sink on an electrical device of high power and reach a good effect of cooling.

The above description of embodiments of this invention is intended to be illustrative and not limiting. Other embodiments of this invention will be obvious to those skilled in the art in view of the above disclosure.

What is claimed is:

1. A fixture for an electrical device comprising:
   a pin casing having a bottom and a round-wall forming a trough, the bottom having a first through hole, and the round-wall having at least one flange;

a spring located in the trough of the pin casing;

a ring block having a second through hole, the ring block is positioned and held within the pin casing by the at least one flange of the pin casing; and a pin having a press portion and a wedge portion, wherein the wedge portion of the pin passes through the second through hole of the ring block, the spring and the first through hole of the pin casing, such that the press portion engages the ring block to compress the spring to stably position an electrical device between the pin casing and the wedge portion of the pin.

2. The fixture according to claim 1, wherein a gap is formed on each of two sides of the flange of the round-wall of the pin casing respectively.

3. The fixture according to claim 1, wherein the ring block is connected to the pin.

4. The fixture according to claim 1, wherein the wedge portion of the pin has an arrow shape with two opposing inclinations.

5. A fixture for an electrical device in accordance with claim 4, wherein the wedge portion of the pin forms at least a groove to elasticize the inclinations.

6. A The fixture according to claim 1, wherein the spring is a helical compression spring.

7. The fixture according to claim 1, wherein the spring is a conical compression spring.

\* \* \* \* \*